US006463572B1

United States Patent
Pavisic et al.

(12) 
(10) Patent No.: US 6,463,572 B1
(45) Date of Patent: Oct. 8, 2002

(54) IC TIMING ANALYSIS WITH KNOWN FALSE PATHS

(75) Inventors: Ivan Pavisic, San Jose, CA (US); Pedja Raspopovic, Cupertino, CA (US); Aiguo Lu, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/871,129

(22) Filed: May 31, 2001

(51) Int. Cl.[7] .............................. G06F 9/45; G06F 17/50
(52) U.S. Cl. ................................................ 716/5; 716/6
(58) Field of Search .................................. 716/5, 6, 12

(56) References Cited

U.S. PATENT DOCUMENTS

| | | | | |
|---|---|---|---|---|
| 5,648,909 A | * | 7/1997 | Biro et al. ...................... 716/6 |
| 5,659,486 A | * | 8/1997 | Tamiya ................... 340/286.02 |
| 6,321,186 B1 | * | 11/2001 | Yuan et al. ...................... 716/5 |
| 6,412,096 B1 | * | 6/2002 | Ventrone ........................ 716/2 |

* cited by examiner

Primary Examiner—Huan Hoang
(74) Attorney, Agent, or Firm—Westman, Champlin & Kelly

(57) ABSTRACT

True paths are identified in a timing graph of a circuit in which the timing graph contains known false paths containing nodes of at least two sets selected from FROM, THROUGH and TO nodes. The false paths are processed to include sets of FROM and TO nodes and then transformed into equivalent sets of two logical false paths. True path intervals are constructed as logical subgraphs that do not describe any equivalent false path. In preferred embodiments, the process is carried out by a computer under control of a computer readable program.

19 Claims, 3 Drawing Sheets false_path -from $A_1$ -through $B_1$ -to $C_1$
false_path - $A_2$ -to $C_2$ false_path -from $A_1$ -through $B_1$ -to $C_1$
false_path - $A_2$ -to $C_2$ false_path -from $(A_1-A_2)$ -through $B_1$ -to $C_1$
false_path -from $(A_2-A_1)$ -to $C_2$
false_path -from $(A_1 \cap A_2)$ -through $B_1$ -to $(C_1-C_2)$
false_path -from $(A_1 \cap A_2)$ -to $C_2$ false_path -from $A_1$ -through $B_1$ -to $C_1$
false_path - $A_2$ -to $C_2$

⇩ TRANSFORM FALSE PATHS false_path -from $(A_1-A_2)$ -through $B_1$ -to $C_1$
false_path -from $(A_2-A_1)$ -to $C_2$
false_path -from $(A_1 \cap A_2)$ -through $B_1$ -to $(C_1-C_2)$
false_path -from $(A_1 \cap A_2)$ -to $C_2$

⇩ CONSTRUCT SUBGRAPHS OF TRUE PATHS $INT(A_1 - A_2, C_1, \overline{B_1})$
$INT(A_1 - A_2, E - C_1)$
$INT(A_2 - A_1, E - C_2)$
$INT(A_1 \cap A_2, C_1 - C_2, \overline{B_1})$
$INT(A_1 \cap A_2, E - (C_1 \cup C_2))$
$INT(S - (A_1 \cup A_2), E)$

FIG. 4

IC TIMING ANALYSIS WITH KNOWN FALSE PATHS

FIELD OF THE INVENTION

This invention is directed to the design of integrated circuits, and particularly to performing timing analysis for use during integrated circuit design phases.

BACKGROUND OF THE INVENTION

Timing analysis of an integrated circuit (IC) is performed during the design phase of the IC. More particularly, the circuit designer calculates the times of signal arrival and departure to identify a time delay along a given path in the circuit. The timing analysis is used by the designer to optimize the circuit, resulting in changes to the IC design and the netlist. This procedure is repeated numerous times during IC design causing changes in the netlist.

Timing analysis is performed using a timing graph, which is an oriented graph representing the signal flow. The nodes of the graph are all of the pins in the netlist. To perform timing analysis, the timing graph is traversed twice. In the first pass, graph is traversed from the start points and the worst signal arrival time is calculated at each pin. Similarly, in the second pass, graph is traversed backwards and the departure time (sometimes called the "required" time) is calculated. The departure time represents the required duration for propagation of a signal through the cell. For each pin, the sum of arrival and departure times represents the delay of the worst path going through the pin.

In almost every design, there are paths that the user wants to be disregarded from the timing analysis. These are called "false paths" and are conveyed to the timing analysis engines by the designer or user through "timing constraints". Identifying and removing false paths from consideration is a difficult problem for the circuit designer. Belkhale et al., in "Timing Analysis with Known False Sub Graphs", *Proceedings of the IEEE/ACM International Conference on Computer-Aided Design (ICCAD '95)*, pp 736–740 (1995) suggest identifying portions of the timing graph (subgraphs) that correspond to the false paths. However, the Belkhale et al. technique requires complex computation of multiple arrival and multiple departure times at each node, with different arrival and departure times at a node distinguished based on a set attribute. The set attribute value gives the set of false subgraphs the signal has come through. The complexity of the Belkhale et al. approach expands as the process is repeated for changes in the netlist.

SUMMARY OF THE INVENTION

In accordance with the present invention, a timing graph contains one or more known false paths containing nodes of at least two sets selected from FROM, THROUGH and TO nodes. The false paths are processed to include both FROM and TO nodes. The processed false paths are transformed into equivalent sets of two logical false paths. True path intervals are constructed as logical subgraphs that do not describe any equivalent false path.

In some embodiments, the processing of the false paths include combining false paths having two identical sets of FROM, THROUGH and TO nodes, and normalizing the false paths to have both FROM and TO sets. More particularly, the timing graph is traversed backward from the THROUGH nodes for all false paths having only THROUGH and TO sets to insert FROM sets, and is traversed forward from the THROUGH nodes for all false paths having only FROM and THROUGH sets to insert TO sets.

In other embodiments the false paths are transformed into equivalent sets have either (i) disjoint FROM nodes, or (ii) identical sets of FROM nodes and disjoint TO nodes. More particularly, the false paths are transformed to have sets of either identical or disjoint FROM nodes. The false paths are sorted into groups having common FROM sets, and the false paths having identical FROM sets are transformed to have sets of either identical or disjoint TO nodes.

In preferred embodiments, the process is carried out by a computer under the control of a computer readable program embedded as code on a computer readable medium, such as a hard disk drive. The computer operates under control of the computer readable program code to carry out the process and define the timing of the timing graph.

BRIEF DESCRIPTION OF THE DRAWINGS

FIGS. 2–4 are diagrams useful in explaining various aspects of the present invention.

DETAILED DESCRIPTION OF THE PREFERRED EMBODIMENTS

In accordance with the present invention, the set of false paths is transformed into an equivalent set. The true paths can be easily identified and represented in compact form for efficient and straightforward timing analysis.

The timing graph, T, is a computer-defined oriented graph representing the signal flow, with the nodes of the graph representing all of the pins in the netlist. There are two types of edges. Cell edges correspond to internal cell paths, while net edges correspond to wires. Nodes with no incoming edges are called start points. Start points can be either primary inputs or clock pins on sequential elements, such as flip-flops. Nodes with no outgoing edges are called end points. End points can either be primary outputs or data pins on sequential elements. Nodes that are neither start nor end points are called internal points. As used herein, S denotes the set of all start points, E denotes the set of all end points, I denotes the set of all internal points and T denotes the timing graph.

The false path constraint has the general form false_path -from A -through B -to C, where $A \subset S, B \subset I$ and $C \subset E$, so A, B and C represent the FROM, THROUGH and TO sets respectively. Any one or two of these sets can be omitted, but not all.

Figure 1:
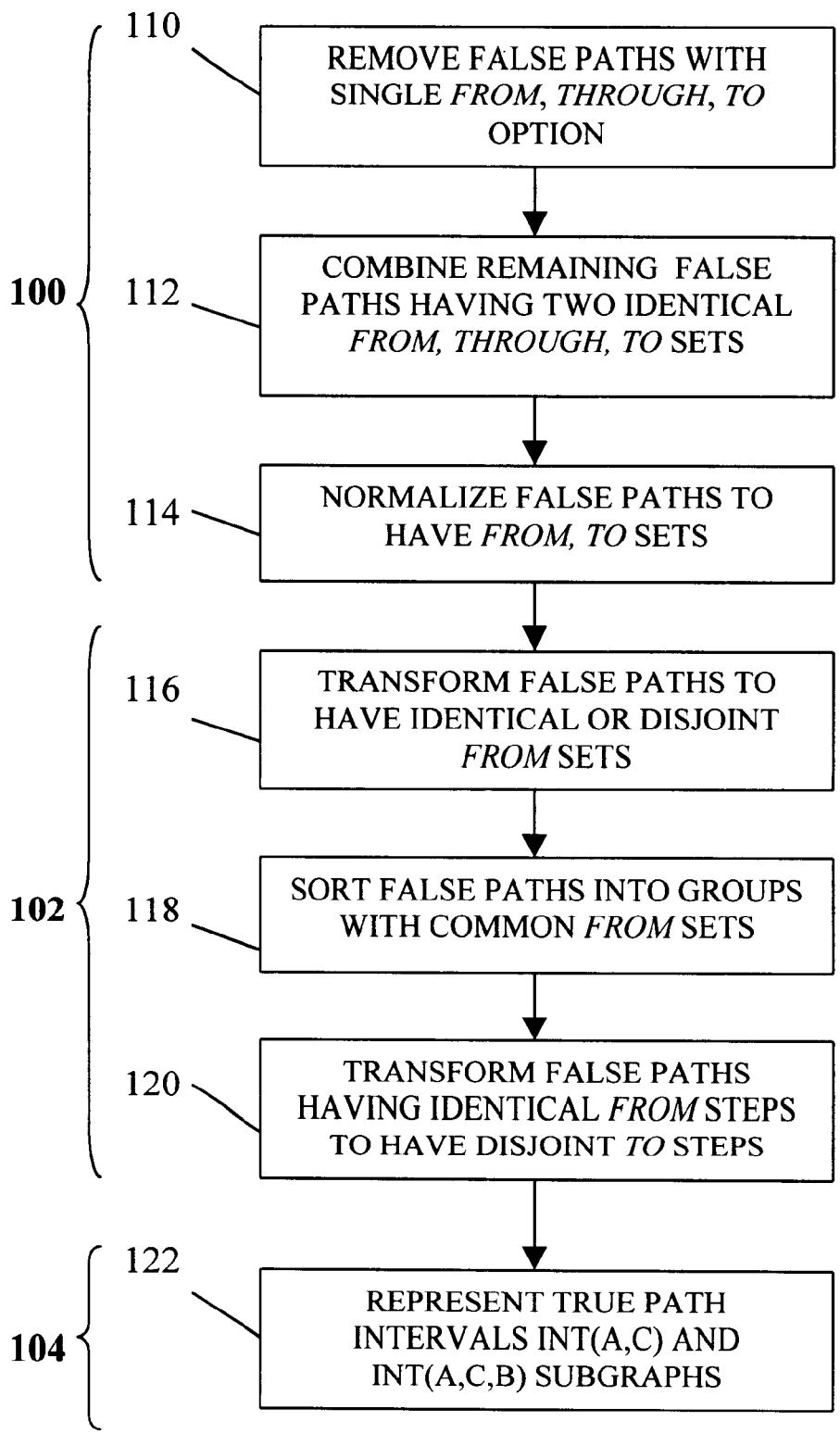
FIG. 1 is a flow diagram illustrating the principal steps of an embodiment of a process for carrying out the present invention.

The problem is to perform timing analysis, ignoring all user-specified false paths. An embodiment of the computer process is illustrated in the flow diagram of FIG. 1 and is accomplished by preprocessing the false paths to combine and normalize the false paths at step 100, transforming the false paths to logical equivalents at step 102, and constructing true path subgraphs at step 104.

At step 110 of preprocessing step 100, false paths with only one FROM, THROUGH or TO set are handled by simply removing corresponding nodes from timing graph T. Those paths are removed from further consideration.

At step 112, the remaining false paths are combined to the extent possible. Two false paths can be combined if they both have at least two of the FROM, THROUGH, TO sets identical. To combine false paths, neighboring false paths are iteratively sorted and combined. For example, the following set of paths.

false_path -from $A_1$ -through $B_1$
false_path -from $A_1$ -through $B_2$
false_path -from $A_2$ -through $B_1$
false_path -from $A_2$ -through $B_2$
can be combined into a single false path
false_path -from $\{A_1,A_2\}$ -through $\{B_1,B_2\}$.

At step 114, the false paths are "normalized" so that they all have FROM and TO sets. For example, if the FROM set is missing, as in
false_path -through B -to C
the timing graph is traversed backwards from B. If A is the set of all start points visited during this process, then the original false path is equivalent to
false_path -from A -through B -to C.
Similarly, if the TO set is missing, as in
false_path -from A -through B
the timing graph is traversed forwards from B. If C is the set of all end points visited during this process, then the original false path is equivalent to
false_path -from A -through B -to C.

The transformation step 102 is performed by transforming the set of false paths into an equivalent set having the following properties:

1. Two false paths have either identical or disjoint FROM sets.
2. If two false paths have identical FROM sets, then they have disjoint TO sets.

At step 116 of the transformation step, the false paths are transformed to satisfy the first property. At step 118, those false paths with common FROM sets are combined into groups. At step 120, each group is then transformed to satisfy the second property.

Figure 2:
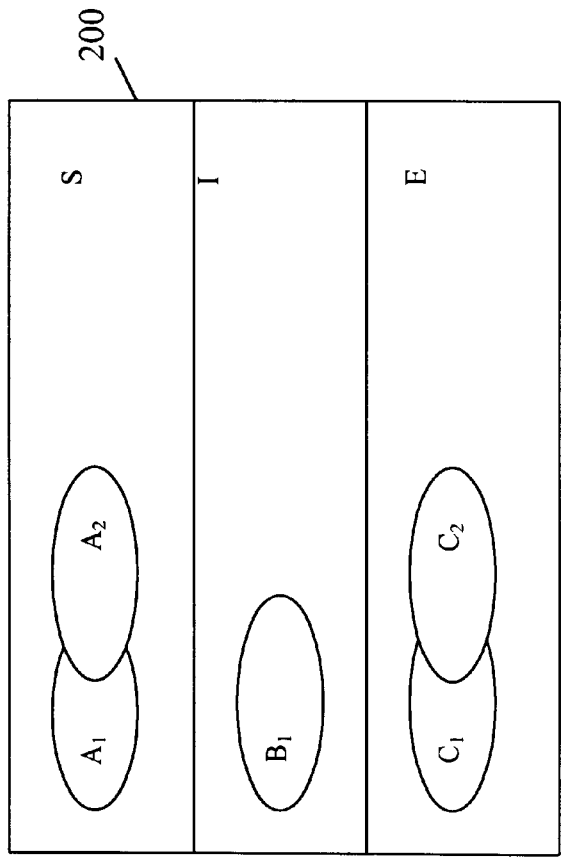

FIG. 2 illustrates the procedure, for a timing graph 200 and two false paths
false_path -from $A_1$ -through $B_1$ -to $C_1$
false_path -from $A_2$ -to $C_2$.

Removal of the intersections of FROM sets results in four false paths
false_path -from $(A_1-A_2)$ -through $B_1$-to $C_1$
false_path -from $(A_2-A_1)$ -to $C_2$
false_path -from $(A_1 \cap A_2)$ through $B_1$-to $C_1$
false_path -from $(A_1 \cap A_2)$ -to $C_2$.

Figure 3:
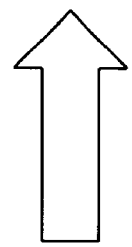

The first property is now satisfied, but the last two paths violate the second property. They have the same FROM set, but their TO sets intersect. As shown in FIG. 3, the TO intersection is disjointed in the last two paths, resulting in a set of false paths as
false_path -from $(A_1-A_2)$ -through $B_1$ -to $C_1$
false_path -from $(A_2-A_1)$ -to $C_2$
false_path -from $(A_1 \cap A_2)$ -through $B_1$ -to $(C_1-C_2)$
false_path -from $(A_1 \cap A_2)$ -to $C_2$.
This set is equivalent to the original set and it satisfies both properties.

Step 104 comprises construction of the true path subgraphs. For a given set of start points A and a given set of end points C, INT(A,C) denotes the subgraph of T which consists of all paths starting at A and ending at C, defining an interval. If B is a set of internal points, then INT(A,C,B) denotes the subgraph obtained from INT(A,C) by removing nodes from B.

Consequently, all true paths can be represented as a set of subgraphs of types INT(A,C) or INT(A,C,B). Timing analysis can then be performed independently on all true subgraphs. These subgraphs do not have any false paths, hence the timing analysis is straightforward.

More particularly, after completing the transformation of the false paths (step 120), the resulting set of false paths has the following general form:
false_path -from $A_1$ -through $B_{1,l}$ -to $C_{1,l}$
false_path -from $A_1$ -through $B_{1,k_1}$ -to $C_{1,k_1}$
false_path -from $A_1$ -to $C_{1,k_1+1}$
false_path -from $A_1$ -to $C_{1,l_1}$
false_path -from $A_2$ -through $B_{2,1}$ -to $C_{2,1}$
false path_from $A_2$ -through $B_{2,k_2}$ -to $C_{2,k_2}$
false_path -from $A_2$ -to $C_{2,k_2+1}$
false_path -from $A_2$ -to $C_{2,l_2}$
false_path -from $A_n$ -through $B_{n,1}$ -to $C_{n,1}$
false_path -from $A_n$ -through $B_{n,k_n}$ -to $C_{n,k_n}$
false_path -from $A_n$ -to $C_{n,k_n+1}$
false_path -from $A_n$ -to $C_{n,l_n}$
where FROM sets $A_1, \ldots, A_n$ are mutually disjoint and, for each i, TO sets $C_{i,1}, \ldots, C_{1,l_i}$ are also mutually disjoint.

At step 122, the true path intervals are represented as sets of subgraphs in the form of INT(A,C) or INT (A,C,B). More particularly, the following set of subgraphs encompasses all of the true paths and contains no false paths:
INT($A_1,C_{1,l},\overline{B_{1,l}}$)
INT($A_1$, $C_{1,k_1},\overline{B_{1,k_1}}$)
INT($A_1$, E−($C_{1,l} \cup \ldots \cup C_{1,l_1}$))
INT($A_2$, $C_{2,l},\overline{B_{2,l}}$)
INT($A_2$ , $C_{2,k_2},\overline{B_{2,k_2}}$)
INT($A_2$,E−($C_{2,l} \cup \ldots \cup C_{2,l_2}$))
INT($A_n$, $C_{n,l},\overline{B_{n,l}}$)
INT($A_n$, $C_{n,k_n},\overline{B_{n,k_n}}$)
INT($A_n$,E−($C_{n,l} \cup \ldots \cup C_{n,l_n}$))
INT(S−($A_1 \cup \ldots \cup A_n$), E)

To demonstrate application of the invention on the example of FIGS. 2 and 3, as shown in FIG. 4, the set of true subparagraphs for the transformed set of false paths of the example shown in FIGS. 2 and 3 is
INT($A_1-A_2,C_1,\overline{B_1}$)
INT($A_1-A_2$,E−$C_1$)
INT($A_2-A_1$,E−$C_2$)
INT($A_1 \cup A_2,C_1-C_2,\overline{B_1}$)
INT($A_1 \cup A_2$,E−($C_1 \cup C_2$))
INT(S−($A_1 \cup A_2$),E)

The present invention thus provides for the identification and representation of the true paths of a timing graph for timing optimization. The process is simple, thereby permitting easy revision of the timing analysis as netlist changes are performed.

In preferred embodiments, a computer carries out the process under the control of a computer readable program embodied as computer readable code in a computer readable medium. A computer version of the timing graph is analyzed by the computer under control of the program, known false paths are transformed into logical equivalents, and subgraphs representing the true paths are constructed.

Although the present invention has been described with reference to preferred embodiments, workers skilled in the art will recognize that changes may be made in form and detail without departing from the spirit and scope of the invention.

What is claimed is:

1. A process of identifying true paths in a timing graph of a circuit, where the timing graph contains one or more known false paths containing nodes of at least two sets of nodes selected from the group consisting of FROM, THROUGH and TO nodes, the process comprising steps of:

a) processing the false paths so that each false path includes sets of FROM and TO nodes;

b) transforming each processed false path into an equivalent set of plural logical false paths; and c) constructing true path intervals as logical subgraphs that do not describe any equivalent false path.

2. The process of claim 1, wherein step (a) includes steps of:

a1) combining false paths having two identical sets of FROM, THROUGH and TO nodes, and a2) normalizing the false paths so that all of the false paths have sets of FROM and TO nodes.

3. The process of claim 2, wherein step a2) includes steps of:

a2a) traversing the timing graph backward from the THROUGH nodes for each false path having only sets of THROUGH and TO nodes to insert a set of FROM nodes, and a2b) traversing the timing graph forward from the THROUGH nodes for each false path having only sets of FROM and THROUGH nodes to insert a set of TO nodes.

4. The process of claim 2, wherein the timing graph contains false paths containing nodes of only a single set selected from the group consisting of FROM, THROUGH and TO nodes, and step (a) further includes:

a3) removing all false paths containing nodes of only a single set from the group.

5. The process of claim 3, wherein each equivalent set has either (i) disjoint FROM sets, or (ii) identical FROM sets and disjoint TO sets.

6. The process of claim 5, wherein step (b) includes:

b1) transforming each false path to have a set of either identical or disjoint FROM nodes, b2) sorting the false paths into groups having common sets of FROM nodes, and b3) transforming the false paths having identical sets of FROM nodes to have a set of disjoint TO nodes.

7. The process of claim 2, wherein each equivalent set has either (i) disjoint FROM sets, or (ii) identical FROM sets and disjoint TO sets.

8. The process of claim 2, wherein step (b) includes:

b1) transforming each false path to have a set of either identical or disjoint FROM nodes, b2) sorting the false paths into groups having common set of FROM nodes, and b3) transforming the false paths having identical sets of FROM nodes to have a set of disjoint TO nodes.

9. The process of claim 1, wherein each equivalent set has either (i) disjoint FROM sets, or (ii) identical FROM sets and disjoint TO sets.

10. The process of claim 1, wherein step (b) includes:

b1) transforming each false path to have a set of either identical or disjoint FROM nodes, b2) sorting the false paths into groups having common sets of FROM nodes, and b3) transforming the false paths having identical sets of FROM nodes to have a set of disjoint TO nodes.

11. A computer useable medium having a computer readable program embodied therein for addressing data to cause the computer to identify true paths in a timing graph of a circuit represented by a netlist, where the timing graph contains one or more known false paths containing nodes of at least two sets selected from the group consisting of FROM, THROUGH and TO nodes, the computer readable program in the computer useable medium comprising:

first computer readable program code for causing the computer to process the false paths so that each false path includes sets of FROM and TO nodes;

second computer readable program code for causing the computer to transform each processed false path into an equivalent set of plural logical false paths; and third computer readable program code for causing the computer to construct true path intervals as logical subgraphs that do not describe any equivalent false path.

12. The computer useable medium of claim 11, wherein the first computer readable program code includes steps of:

fourth computer readable program code for causing the computer to identify and combine false paths having at least two identical sets of FROM, THROUGH and TO nodes, and fifth computer readable program code for causing the computer to normalize the false paths so that all of the false paths have sets of FROM and TO nodes.

13. The computer useable medium of claim 12, wherein the fifth computer readable program code includes:

computer readable program code for causing the computer to identify each false path having only sets of THROUGH and TO nodes and each false path having only sets of THROUGH and FROM nodes, computer readable program code for causing the computer to traverse the timing graph backward from the THROUGH node for each false path having only sets of THROUGH and TO nodes to insert a set of FROM nodes, and computer readable program code for causing the computer to traverse the timing graph forward from the THROUGH nodes for each false path having only sets of FROM and THROUGH nodes to insert a set of TO nodes.

14. The computer useable medium of claim 12, wherein the timing graph contains false paths containing nodes of only a single set of the sets of FROM, THROUGH and TO nodes, and the first computer readable program code further includes:

computer readable program code for causing the computer to remove all false paths containing nodes of only a single set.

15. The computer useable medium of claim 11, wherein the second computer readable program code includes:

computer readable program code for causing the computer to transform each false path to have a set of either identical or disjoint FROM nodes, computer readable program code for causing the computer to sort the transformed false paths into groups having common sets of FROM nodes, and computer readable program code for causing the computer to transform the sorted false paths having identical sets of FROM nodes to have sets of disjoint TO nodes.

16. In a computer process of designing an integrated circuit wherein a netlist defines the integrated circuit, a process of analyzing timing of the integrated circuit comprising steps of:

a) providing a timing graph for the integrated circuit, wherein the timing graph contains one or more known false paths containing nodes of at least two sets selected from the group consisting of FROM, THROUGH and TO nodes;

b) processing the false paths to include FROM and TO nodes;

c) transforming each processed false path into an equivalent set of plural logical false paths; and d) identifying true path intervals as logical subgraphs that do not describe any equivalent false path.

17. The process of claim 16, wherein step (b) includes steps of:

b1) combining false paths having two identical sets of FROM, THROUGH and TO nodes, and b2) normalizing the false paths so that all of the false paths have sets of FROM and TO nodes.

18. The process of claim 17, wherein step b2) includes steps of:

b2a) traversing the timing graph backward from the THROUGH nodes for each false path having only sets of THROUGH and TO nodes to insert a set of FROM nodes, and b2b) traversing the timing graph forward from the THROUGH nodes for each false path having only sets of FROM and THROUGH nodes to insert a set of TO nodes.

19. The process of claim 17, wherein the timing graph contains false paths containing nodes of only a single set selected from the group consisting of FROM, THROUGH and TO nodes, and step (b) further includes:

b3) removing all false paths containing nodes of only the single set.

* * * * *